(12) United States Patent
Fujikura et al.

(10) Patent No.: US 7,294,200 B2
(45) Date of Patent: Nov. 13, 2007

(54) METHOD FOR PRODUCING NITRIDE SEMICONDUCTOR CRYSTAL, AND NITRIDE SEMICONDUCTOR WAFER AND NITRIDE SEMICONDUCTOR DEVICE

(75) Inventors: Hajime Fujikura, Tokyo (JP); Kazuyuki Iizuka, Tokyo (JP)

(73) Assignee: Hitachi Cable, Ltd., Tokyo (JP)

( * ) Notice: Subject to any disclaimer, the term of this patent is extended or adjusted under 35 U.S.C. 154(b) by 476 days.

(21) Appl. No.: 10/396,831

(22) Filed: Mar. 26, 2003

(65) Prior Publication Data
US 2003/0183160 A1 Oct. 2, 2003

(30) Foreign Application Priority Data
Mar. 26, 2002 (JP) .............................. 2002-086615

(51) Int. Cl.
*C30B 23/00* (2006.01)
*H01L 21/00* (2006.01)
*H01L 29/221* (2006.01)

(52) U.S. Cl. ............................. 117/86; 117/88; 117/89; 117/90; 117/952; 117/56; 438/93; 438/479; 438/481; 257/13; 257/94; 257/96; 257/97; 257/98; 257/103; 257/184

(58) Field of Classification Search ................. 117/86, 117/88–90, 56, 952; 438/93, 479, 481; 257/13, 257/94, 96–98, 103, 184
See application file for complete search history.

(56) References Cited

U.S. PATENT DOCUMENTS

| 4,758,529 | A | * | 7/1988 | Ipri ............................ 438/165 |
| 5,290,393 | A | | 3/1994 | Nakamura |
| 5,739,554 | A | * | 4/1998 | Edmond et al. ............ 257/103 |
| 5,966,620 | A | * | 10/1999 | Sakaguchi et al. .......... 438/455 |
| 6,306,212 | B1 | * | 10/2001 | Santiago et al. ............... 117/92 |
| 6,331,063 | B1 | * | 12/2001 | Kamada et al. ............. 362/237 |
| 6,350,703 | B1 | * | 2/2002 | Sakaguchi et al. .......... 438/766 |
| 6,534,382 | B1 | * | 3/2003 | Sakaguchi et al. .......... 438/455 |
| 6,967,122 | B2 | * | 11/2005 | Tezen .......................... 438/93 |

* cited by examiner

*Primary Examiner*—Duane Smith
*Assistant Examiner*—G. Nagesh Rao
(74) *Attorney, Agent, or Firm*—Sughrue Mion, PLLC

(57) ABSTRACT

A method for producing a nitride semiconductor crystal comprising steps (a), (b) and (c), which steps follow in sequence as follows: a step (a) for forming fine crystal particles made of a nitride semiconductor on a substrate; a step (b) for forming a nitride semiconductor island structure having a plurality of facets inclined relative to a surface of the substrate using the fine crystal particles as nuclei; and a step (c) for causing the nitride semiconductor island structure to grow in a direction parallel with a surface of the substrate to merge a plurality of the nitride semiconductor island structures with each other, thereby forming a nitride semiconductor crystal layer having a flat surface; the steps (a)-(c) being continuously conducted in the same growing apparatus.

22 Claims, 8 Drawing Sheets $T_{g2} = 1050°C$   $T_{g2} = 950°C$   $T_{g2} = 900°C$ ⊢——⊣
2μm Crystal-Growing Temperature $T_{g2}$ (°C) in Step (b)

Hydrogen Concentration (%) in Crystal-Growing Atmosphere in Step (b)

Crystal-Growing Temperature $T_{g3}$ (°C) in Step (c)

Crystal-Growing Atmosphere Pressure (Torr) in Step (c)

METHOD FOR PRODUCING NITRIDE SEMICONDUCTOR CRYSTAL, AND NITRIDE SEMICONDUCTOR WAFER AND NITRIDE SEMICONDUCTOR DEVICE

FIELD OF THE INVENTION

The present invention relates to a method for producing a nitride semiconductor crystal having a small dislocation density, a nitride semiconductor wafer having a nitride semiconductor crystal formed by such a method, and a nitride semiconductor device produced therefrom.

BACKGROUND OF THE INVENTION

The easiest method for forming a semiconductor epitaxial layer is generally to form a single crystal substrate made of the same material as that of a semiconductor to be grown, and to cause a vapor-phase growth of a semiconductor crystal on the resultant substrate, with actual success in various materials. However, because the single crystal substrate is not only technically difficult to obtain but also high in cost, a semiconductor crystal different from the substrate should often be caused to grow on the substrate. In such a case, known combinations of the substrates and the semiconductor crystals are, for instance, GaAs on a silicon substrate, a nitride semiconductor on a sapphire or silicon carbide substrate, II-VI group semiconductors on a GaAs substrate, etc.

However, when a semiconductor different from a substrate is caused to grow on the substrate, dislocations are likely introduced in a high density into a grown semiconductor epitaxial layer, because of the mismatch of various characteristics such as lattice, a thermal expansion coefficient, surface energy, etc. Because the dislocations in the semiconductors may constitute non-radiative recombination centers, scattering centers, etc. in semiconductor devices such as optical devices, electronic devices, etc., devices using high-dislocation-density semiconductors are extremely poor in characteristics and stability.

Because bulk crystal growth is also difficult in nitride semiconductors typically including gallium nitride (GaN), aluminum gallium nitride (AlGaN), indium gallium nitride (InGaN), etc., single crystal substrates with practically acceptable sizes have not been obtained yet. Accordingly, methods for causing nitride semiconductor crystals to grow epitaxially on substrates such as sapphire, silicon carbide, etc. are generally used. Still, dislocations remain serious problems as described above.

Recently proposed (JP 8-8217 B, etc.) is the reduction of a dislocation density in a nitride semiconductor layer by "a two-stage growing method" using a metal-organic vapor-phase epitaxy method (MOVPE method). FIG. 4 is a graph showing temperature variation at the time of crystal growth in a conventional two-stage growing method. In this method, after a hydrogen gas is blown at as high a temperature as 1000 C or higher onto a substrate surface of sapphire, etc. to remove an oxide film from the surface (hydrogen cleaning), (i) a low-temperature buffer layer made of GaN, AlN, etc. is caused to grow at 500-600 C on the substrate, (ii) the temperature is elevated to about 1000 C (annealing), and (iii) a nitride semiconductor layer made of GaN, etc. is caused to grow at about 1000 C. In the step (i), the crystal-growing temperature is lower than the melting point of GaN, AlN, etc., resulting in the formation of a polycrystalline, low-temperature buffer layer. In the subsequent step (ii), the low-temperature buffer layer is partially turned to a single crystal by elevating the temperature to about 1000 C. In the step (iii), an epitaxial layer made of GaN, etc. is formed with this single crystal as nuclei. According to this method, the dislocation density of GaN on a sapphire substrate can be reduced from $10^{10}$-$10^{11}$ cm$^{-2}$ to about $10^9$ cm$^{-2}$.

However, the reduction of a dislocation density by the two-stage growing method is still insufficient, and the dislocation density often cannot be reduced sufficiently depending on the types and structures of a crystal-growing apparatus. Conditions suitable for the reduction of dislocations may be achieved in some particular crystal-growing apparatuses. Even in such a case, the apparatuses may be subjected to variations in conditions, etc. for a long period of operation, affecting crystal growth conditions. Therefore, it is difficult to stably grow nitride semiconductor layers with small dislocation densities.

OBJECT OF THE INVENTION

Accordingly, an object of the present invention is to provide a method for producing a nitride semiconductor crystal having a small dislocation density on the entire surface of a substrate by properly controlling its crystal growth, a nitride semiconductor wafer having the nitride semiconductor crystal obtained by such method, and a nitride semiconductor device formed with such a nitride semiconductor wafer.

DISCLOSURE OF THE INVENTION

As a result of investigation on the relation between crystal conditions at each growth stage and a final dislocation density in nitride semiconductor crystals grown on various substrates, the inventors have found that after forming a nitride semiconductor island structure using fine crystal particles of a nitride semiconductor as nuclei, if the nitride semiconductor island structure is caused to grow in a direction parallel with the substrate surface until the nitride semiconductor island structures are bonded to each other, the dislocation density would be able to be reduced to about $10^8$ cm$^{-2}$-$10^7$ cm$^{-2}$, lower than the conventional level. The present invention has been completed based on this finding.

Thus, the method for producing a nitride semiconductor crystal according to the present invention comprises steps (a), (b) and (c), which steps follow in sequence as follows: a step (a) for forming fine crystal particles made of a nitride semiconductor on a substrate; a step (b) for forming a nitride semiconductor island structure having a plurality of facets inclined relative to a surface of the substrate using the fine crystal particles as nuclei; and a step (c) for causing the nitride semiconductor island structure to grow in a direction parallel with a surface of the substrate to merge a plurality of the nitride semiconductor island structures with each other, thereby forming a nitride semiconductor crystal layer having a flat surface; the steps (a)-(c) being continuously conducted in the same growing apparatus.

The substrate may be (1) a substrate made of a nitride semiconductor sapphire, silicon carbide, silicon, zinc oxide, LiGaO$_2$ or LiAlO$_2$, or (2) a composite substrate having a nitride semiconductor layer formed on a surface of a substrate body made of a nitride semiconductor, sapphire, silicon carbide, silicon, zinc oxide, LiGaO$_2$ or LiAlO$_2$.

When the substrate (1) is used, the step (a) preferably comprises a step for forming a nitride semiconductor crystal buffer layer on the substrate at a lower temperature than a crystal-growing temperature in the steps (b) and (c), and a step for heat-treating the nitride semiconductor crystal buffer layer at a higher temperature than its crystal-growing temperature to form the fine crystal particles, whereby step (a) thus comprises two seperate steps at two seperate temperatures.

When the composite substrate (2) is used, the fine crystal particles are formed preferably by causing a nitride semiconductor crystal to grow on the composite substrate having fine roughness on a surface on the side of the nitride semiconductor layer, or by causing a nitride semiconductor crystal to grow on the composite substrate partially covered by a material hindering interactions between atoms constituting the nitride semiconductor layer of the composite substrate, and atoms constituting the nitride semiconductor crystal growing thereon. Fine roughness is preferably formed on a surface of the composite substrate, by exposing the nitride semiconductor layer surface to an ozone atmosphere, by heat-treating the nitride semiconductor layer surface, or by bringing the nitride semiconductor layer surface into contact with an etching gas. Preferably used as the material hindering interactions between the atoms is silicon, oxygen, silicon nitride, silicon oxide or a metal. The step (a) preferably comprises placing the composite substrate in a growing apparatus, and introducing a starting material gas into the growing apparatus to form the fine crystal particles made of a nitride semiconductor.

The conditions of growing the nitride semiconductor crystal are preferably different in the steps (a)-(c). Specifically, at least one of a temperature, an atmosphere pressure, a speed and an atmosphere composition for crystal growth is preferably different among the steps (a)-(c). The nitride semiconductor crystal is preferably caused to grow by selecting at least one of a crystal growth condition (1) that a crystal-growing temperature in the step (b) is lower than that in the step (c), a crystal growth condition (2) that the hydrogen concentration in a crystal-growing atmosphere in the step (b) is higher than that in the step (c), a crystal growth condition (3) that a crystal-growing atmosphere pressure in the step (b) is higher than that in the step (c), and a crystal growth condition (4) that a crystal-growing speed in the step (b) is lower than that in the step (c).

In the present invention, the fine crystal particles of a nitride semiconductor are preferably made of $In_nGa_{1-n}N$ ($0<n \leq 0.3$). The nitride semiconductor island structure and the nitride semiconductor crystal layer formed in the step (c) may have the same or different compositions. In the case of having the same composition, both of them are preferably made of GaN.

To decrease a dislocation density by controlling the propagation direction of dislocations, it is advantageous to provide the nitride semiconductor island structure and the nitride semiconductor crystal layer growing from the nitride semiconductor island structure in a direction parallel with the substrate surface with different compositions, thereby introducing lattice strain into the surface of the island structure. In this case, it is preferable that any of the nitride semiconductor island structure and the nitride semiconductor crystal layer has a composition represented by $In_xAl_yGa_zN$ ($x+y+z=1$), though they have different contents of In and/or Al. The nitride semiconductor crystal layer is preferably constituted by a layer having a composition represented by $Al_yGa_{1-y}N$ ($0<y \leq 1$), and a layer having a composition represented by GaN.

Part or all of the growing of the nitride semiconductor crystal is preferably conducted by an MOVPE method or an HVPE method. It is preferable to accelerate the formation of the nitride semiconductor island structure by adding In, Al or Si to a nitride semiconductor crystal in the step (b). In the step (c), Mg is preferably added to a nitride semiconductor crystal growing from the nitride semiconductor island structure in a direction parallel with the substrate surface to obtain a nitride semiconductor crystal layer having a flat surface.

In the method of the present invention, a temperature, at which the nitride semiconductor crystal buffer layer is formed, is preferably 400 to 800° C. The heat-treating temperature of the nitride semiconductor crystal buffer layer is preferably 800 to 1200° C. The crystal-growing temperature is preferably 800 to 1050° C. in the step (b) and 1050 to 1200° C. in the step (c).

The hydrogen concentration in the crystal-growing atmosphere is preferably 50% or more in the step (b) and 0 to 30% in the step (c). The crystal-growing atmosphere pressure is preferably 300 to 800 Torr in the step (b) and 70 to 150 Torr in the step (c). The crystal-growing speed is preferably 0.1 to 4 µm/hr in the step (b) and 2 to 8 µm/hr in the step (c).

The nitride semiconductor wafer of the present invention has a plurality of semiconductor layers formed on a nitride semiconductor crystal obtained by the above method. According to the method of the present invention, a dislocation density can be $1 \times 10^9$ cm$^{-2}$ or less on the entire surface of the nitride semiconductor crystal.

The semiconductor device of the present invention is constituted with the nitride semiconductor wafer of the present invention.

DESCRIPTION OF THE PREFERRED EMBODIMENTS

[1] Production of Nitride Semiconductor Crystal

Figure 1A:
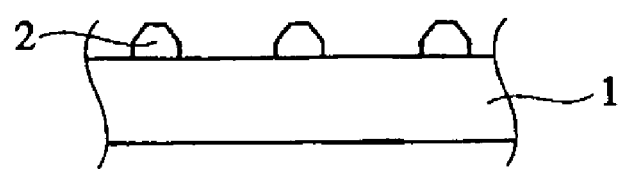
FIG. 1(a) is a schematic view showing the cross section structure of a nitride semiconductor crystal in a step of forming fine crystal particles.
Figure 1B:
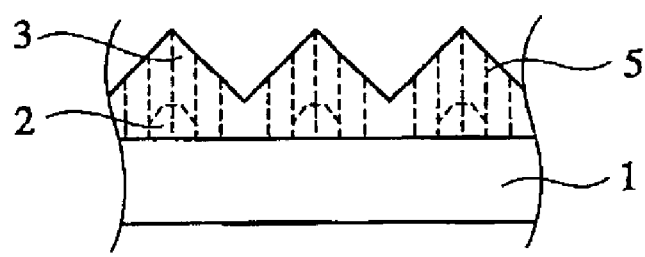
FIG. 1(b) is a schematic view showing the cross section structure of a nitride semiconductor crystal in a step of forming a nitride semiconductor island structure.
Figure 1C:
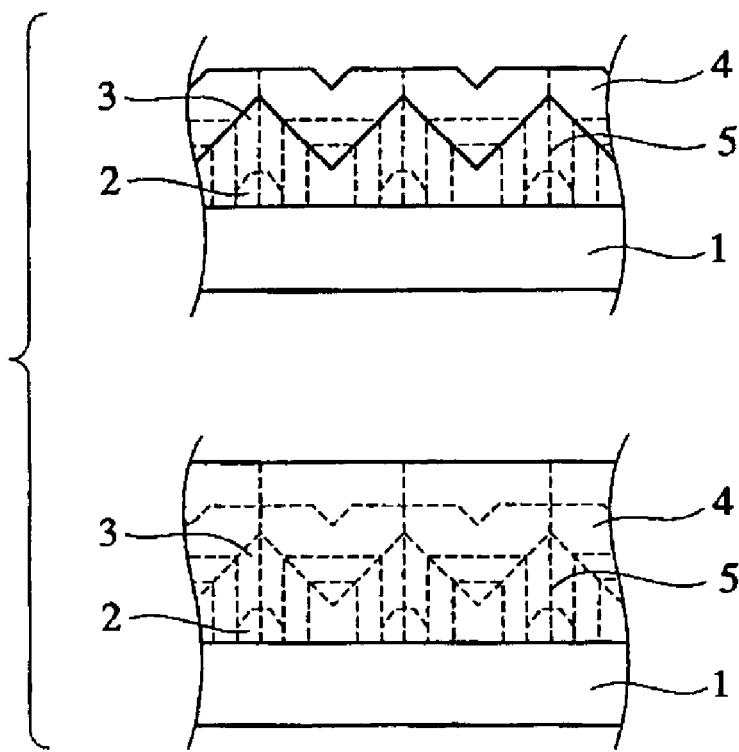
FIG. 1(c) is a schematic view showing the cross section structure of a nitride semiconductor crystal in a step of integrating nitride semiconductor island structures.

FIG. 1 is a schematic view showing the cross section structure of a nitride semiconductor crystal in each step. In the step (a), fine crystal particles 2 made of a nitride semiconductor are formed on a substrate 1. Even though there is large mismatch in material properties between the substrate 1 and the nitride semiconductor, it is possible to keep a state in which atoms constituting the nitride semiconductor crystal are bonded to each other without disturbance, as long as the crystal is in contact with the substrate in a small area as in FIG. 1(a), whereby no dislocation is introduced into the fine crystal particles 2.

In the step (b), a nitride semiconductor island structure 3 having a plurality of facets inclined relative to a substrate surface is formed with the resultant fine crystal particles 2 as nuclei. Dislocations 5 are introduced into the island structure 3, because the island structure 3 has a large area in which the crystal is in contact with the substrate. The dislocations 5 propagate to the facets in a direction perpendicular to the substrate surface. It is important that the nitride semiconductor island structure 3 comprises substantially polygonal pyramids. Formed depending on the growing conditions may not be a nitride semiconductor island structure 3 in a shape of a polygonal pyramid, but an island structure consisting of facets perpendicular to the substrate and facets parallel with the substrate. In this case, however, the dislocations 5 on the surface of the nitride semiconductor crystal layer 4 are not drastically decreased.

In the step (c), the nitride semiconductor island structure 3 is caused to grow in a direction parallel with the surface of the substrate 1, so that a plurality of island structures 3 are bonded (integrated) to each other, thereby forming a nitride semiconductor crystal layer 4 having a flat surface. By the step (c), the propagation directions of dislocations 5 are changed to directions parallel with the substrate surface.

When the adjacent nitride semiconductor island structures 3 are bonded to each other, the dislocations constitute loops, resulting in drastic decrease in the dislocations 5 appearing on the surface of the flat crystal layer 4.

The above steps (a)-(c) are continuously conducted in the same growing apparatus. If a crystal is continuously caused to grow in one growing apparatus, a layer surface is not oxidized by contact with the air, unlike in a case where the crystal is transferred from other apparatuses. Accordingly, there is no chance of deteriorating the crystallinity of a semiconductor layer subsequently formed.

The nitride semiconductor crystal is caused to grow preferably in a vapor-phase growing apparatus, for instance, in a metal-organic vapor-phase epitaxy (MOVPE) apparatus or a hydride vapor-phase epitaxy (HVPE) apparatus. Nitride semiconductor crystals with good crystallinity can be caused to grow by an MOVPE method, while nitride semiconductor crystals can be caused to grow efficiently by an HVPE method because of a high crystal-growing speed. Incidentally, because the MOVPE method and the HVPE method per se are known to the public, their conditions can be properly selected. The MOVPE method may be combined with the HVPE method; for instance, a nitride semiconductor crystal is first caused to grow epitaxially on the substrate by the MOVPE method to form fine crystal particles [step (a)], and crystal growth thereon can then be conducted in the steps (b) and (c) by the HVPE method.

The conditions of growing the nitride semiconductor crystal are preferably different in the steps (a)-(c), and it is more preferable that at least one of a temperature, an atmosphere pressure, a speed and an atmosphere composition for crystal growth is different among the steps (a)-(c).

(a) Step of Forming Fine Crystal Particles

Fine crystal particles made of a nitride semiconductor are formed on the substrate in this step. The substrate is preferably made of a material close to the nitride semiconductor in a lattice constant and a thermal expansion coefficient. Specifically, it is preferable to use (1) a substrate made of a nitride semiconductor, sapphire, silicon carbide, silicon, zinc oxide, $LiGaO_2$ or $LiAlO_2$, or (2) a composite substrate having a nitride semiconductor layer formed on a substrate body made of a nitride semiconductor, sapphire, silicon carbide, silicon, zinc oxide, $LiGaO_2$ or $LiAlO_2$. The substrate or the substrate body is preferably sapphire.

To avoid the deterioration of the crystallinity of a growing nitride semiconductor, the surface roughness of the substrate is preferably 5 μm or less by TTV (total thickness variation). The crystal growth face of the substrate is preferably within a C face ±5° or within an A face ±5°. If the face direction of the substrate is within a C face ±5° (a C face, or a face inclined within 5° from the C face), or within an A face ±5° (an A face, or a face inclined within 5° from the A face), the epitaxial growth of the nitride semiconductor on the substrate can be growth from the C face, which provides an epitaxial layer with good crystallinity. The thickness of the substrate may be properly selected, taking into consideration materials for the substrate and crystal growth procedures. To prevent the distortion of the substrate due to the difference in a linear thermal expansion coefficient, it is preferably 500 μm or less in the case of a sapphire substrate.

When the substrate is made of a material listed in (1), the step (a) preferably comprises a step for forming a nitride semiconductor crystal buffer layer on the substrate at a lower crystal-growing temperature $Tg_1$ than the crystal-growing temperature in the steps (b) and (c), and a step for heat-treating the nitride semiconductor crystal buffer layer at a higher temperature than its crystal-growing temperature to form fine crystal particles. $Tg_1$ is preferably 400-800 C. When $Tg_1$ is lower than 400 C, the buffer layer is less likely to grow. On the other hand, when $Tg_1$ is higher than 800 C, a nitride semiconductor crystal buffer layer of a single crystal is formed, making it difficult to form fine crystal particles. Subsequently, the nitride semiconductor crystal buffer layer is turned to fine crystal particles by a heat treatment. At this time, temperature elevation is preferably to a range of 800-1200 C.

When the composite substrate listed in (2) is used, the fine crystal particles are preferably formed by causing a nitride semiconductor crystal to grow on a composite substrate having fine roughness on a surface on the side of the nitride semiconductor layer, or by causing a nitride semiconductor crystal to grow on a composite substrate partially covered by a material hindering interactions between atoms constituting the nitride semiconductor layer of the composite substrate and atoms constituting a nitride semiconductor crystal growing thereon.

Preferably usable as the material hindering interactions between atoms are silicon, oxygen, silicon nitride, silicon oxide or a metal. Subsequently, when a nitride semiconductor crystal is caused to grow on the substrate, crystal growth occurs only in regions not covered by the above material, thereby forming fine crystal particles. When a vapor-phase growing method is used for crystal growth, for instance, a Si-containing gas such as tetraethyl silane (TESi), silane ($SiH_4$), etc. may be brought into contact with a GaN surface of a composite substrate of sapphire/GaN.

To form fine roughness on a surface of the composite substrate, the nitride semiconductor layer surface is preferably exposed to an ozone atmosphere, heat-treated, or brought into contact with an etching gas. In a preferred heat treatment of the nitride semiconductor layer surface, the nitride semiconductor layer surface of the composite substrate is heat-treated at 700-1300 C for 5-15 minutes in a crystal-growing apparatus with a hydrogen atmosphere. On the other hand, when the composite substrate surface is etched with a gas, a supplied gas may differ depending on the material of the substrate surface. When the substrate surface is made of GaN, a chlorinated gas, a hydrogen gas, etc. may be used. When the nitride semiconductor layer surface is exposed to an ozone atmosphere, for instance, the layer surface is preferably exposed to an ozone atmosphere for 5-15 minutes outside the crystal-growing apparatus.

When the composite substrate listed in (2) is used, the fine crystal particles of a nitride semiconductor are formed with the surface roughness of the composite substrate thus obtained as nuclei. In this case, the step (a) preferably comprises placing the composite substrate in a crystal-growing apparatus, and introducing a starting material gas at 800-1300 C into a crystal-growing apparatus to cause a nitride semiconductor crystal to grow, thereby forming fine crystal particles made of a nitride semiconductor.

Though the crystal does not necessarily grow in a flat layer state, the thickness of each layer, which has grown from the starting material supplied on the substrate in a flat layer state, is represented by $t_{FL}$. The height of fine crystal particles on the substrate is preferably set such that $t_{FL}$ is 0.01-0.1 μm.

The fine crystal particles of a nitride semiconductor formed on the substrate are preferably made of $In_nGa_{1-n}N$ (0<n≦0.3). To make the formation of fine particles of a single crystal easy, and to obtain a low-dislocation-density nitride semiconductor crystal layer, n is more preferably 0.02-0.2. When GaN is used for the nitride semiconductor island structure and the nitride semiconductor crystal layer, the fine crystal particles with improved crystallinity can be formed by GaN without suffering from material mismatch.

(b) Formation of Nitride Semiconductor Island Structure [step (b)] and Bonding Step [step (c)]

The nitride semiconductor island structure has a plurality of facets inclined relative to the substrate surface. Because this island structure has a large contact area with the substrate, dislocations are introduced. The dislocations generated propagate in a direction perpendicular to an interface with the substrate. Thus, even if the epitaxial layer is made thicker, no decrease in dislocations is appreciated. However, because the nitride semiconductor island structure further grows in a direction parallel with the substrate surface to form the nitride semiconductor crystal layer in the present invention, the propagation directions of dislocations are changed in directions parallel with the substrate surface. When the nitride semiconductor crystal layer becomes sufficiently thick, the dislocations reach the end of the crystal or forms closed loops, resulting in drastic decrease in dislocations appearing on the layer surface.

The nitride semiconductor island structure and the nitride semiconductor crystal layer formed in the step (c) may have the same or different compositions. In the case of having the same composition, both of them are preferably made of GaN, to suppress lattice mismatch from appearing on the nitride semiconductor crystal layer.

On the other hand, with the nitride semiconductor island structure and the nitride semiconductor crystal layer having different compositions, the lattice strain can be introduced to effectively control the propagation directions of dislocations, thereby decreasing the dislocation density on the crystal layer surface. In this case, though any of the nitride semiconductor island structure and the nitride semiconductor crystal layer may have a composition represented by $In_xAl_yGa_zN$ (x+y+z=1), they preferably have different contents of In and/or Al. The nitride semiconductor crystal layer growing from the nitride semiconductor island structure in a direction parallel with the substrate surface is preferably constituted by a layer having a composition represented by $Al_yGa_{1-y}N$ (0<y≦1) and a layer having a composition represented by GaN. In the layer made of $Al_yGa_{1-y}N$ (0<y≦1), 0<y≦0.2 is more preferable.

Figure 2A:
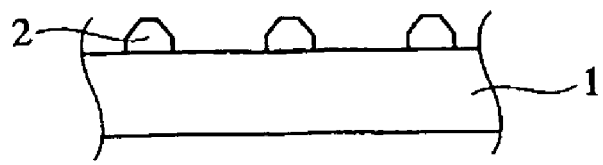
FIG. 2(a) is a schematic view showing the cross section structure of a nitride semiconductor crystal in a step of forming fine crystal particles, in a case where two types of nitride semiconductor crystals having different compositions are caused to grow in a step (b)
Figure 2B:
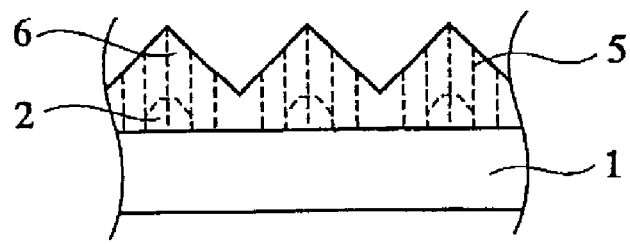
FIG. 2(b) is a schematic view showing the cross section structure of a nitride semiconductor crystal in a step of forming a nitride semiconductor island structure, in a case where two types of nitride semiconductor crystals having different compositions are caused to grow in a step (b)
Figure 2C:
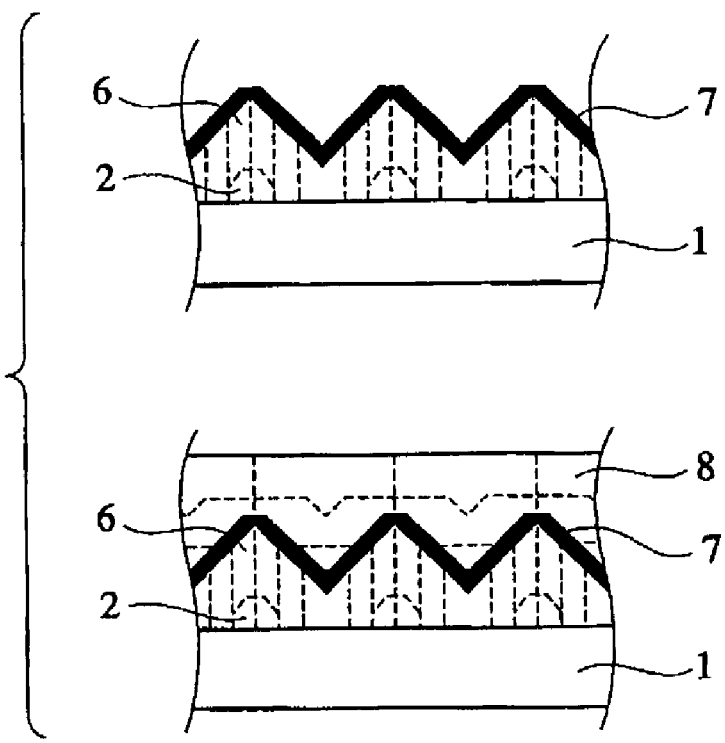
FIG. 2(c) is a schematic view showing the cross section structure of a nitride semiconductor crystal in a step of integrating nitride semiconductor island structures, in a case where two types of nitride semiconductor crystals having different compositions are caused to grow in a step (b)

FIG. 2 shows the cross section structure of a nitride semiconductor crystal according to one preferred embodiment, when the nitride semiconductor island structure and the nitride semiconductor crystal layer have different compositions. An island structure 6 made of GaN is first formed on the fine crystal particles 2 of a nitride semiconductor formed on the substrate 1. Next, a nitride semiconductor crystal layer 7 made of $Al_yGa_{1-y}N$ (0<y≦1) was formed to a thickness $t_{FL}$ of 200 nm or less from the island structure 6 in a direction parallel with the substrate surface, and a nitride semiconductor crystal layer 8 made of GaN is further formed. When the nitride semiconductor crystal layer 7 made of $Al_yGa_{1-y}N$ (0<y≦1) has a thickness $t_{FL}$ exceeding 200 nm, there undesirably arises lattice mismatch with the nitride semiconductor crystal layer 8 made of GaN, resulting in rather increase in the dislocation density.

What is important in the steps (b) and (c) is that the facets of the nitride semiconductor island structure are inclined to the substrate surface, and that the nitride semiconductor island structures are bonded (integrated) to each other, so that the nitride semiconductor crystal layer has a flat surface. Accordingly, at least one of a temperature, an atmosphere pressure, a speed and an atmosphere composition for the crystal growth of the nitride semiconductor is preferably controlled, specifically, the nitride semiconductor crystal is preferably caused to grow by selecting at least one of a crystal growth condition (1) that a crystal-growing temperature in the step (b) is lower than that in the step (c), a crystal growth condition (2) that the hydrogen concentration in a crystal-growing atmosphere in the step (b) is higher than that in the step (c), a crystal growth condition (3) that a crystal-growing atmosphere pressure in the step (b) is higher than that in the step (c), and a crystal growth condition (4) that a crystal-growing speed in the step (b) is lower than that in the step (c). When the steps (b) and (c) are conducted in a vapor-phase growing apparatus, the hydrogen concentration and pressure in the atmosphere can easily be controlled.

The crystal-growing temperature $Tg_2$ in the step (b) is preferably 800-1050 C, more preferably 850-950 C. The crystal-growing temperature $Tg_3$ in the step (c) is preferably 1050-1200 C, more preferably 1050-1150 C.

The hydrogen concentration in the crystal-growing atmosphere in the step (b) is preferably 10% or more, more preferably 50% or more. The hydrogen concentration in the crystal-growing atmosphere in the step (c) is preferably 0-50%, more preferably 0-30%.

The atmosphere pressure for crystal growth in the step (b) is preferably 300-800 Torr, more preferably 600-800 Torr. The crystal-growing atmosphere pressure in the step (c) is preferably 70-150 Torr, more preferably 70-100 Torr.

The crystal-growing speed in the step (b) is preferably 0.1-4 μm/hr, more preferably 0.1-2 μm/hr. The crystal-growing speed in the step (c) is preferably 2-8 μm/hr, more preferably 4-8 μm.

It is preferable to accelerate the growth of the nitride semiconductor crystal islandlike or in a direction parallel with the substrate by an additive. Preferable as materials accelerating the formation of the nitride semiconductor island structure are In, Al and Si. A preferable material for obtaining a nitride semiconductor crystal layer having a flat surface is Mg. The additive is preferably added to each layer in a proportion of $1 \times 10^{16} - 5 \times 10^{20}$ cm$^{-3}$.

The thickness $t_{FL}$ of the nitride semiconductor island structure is preferably 0.1-1 μm, and the thickness $t_{FL}$ of the nitride semiconductor crystal layer is preferably 1-10 μm.

[2] Nitride Semiconductor Wafer and Nitride Semiconductor Device

The nitride semiconductor wafer of the present invention is obtained by forming a plurality of semiconductor layers on a nitride semiconductor crystal produced by the above method. According to the method of the present invention, the dislocation density on the entire surface of the nitride semiconductor crystal can be made as low as $1 \times 10^9$ cm$^{-2}$ or less, resulting in a high-performance nitride semiconductor wafer. A semiconductor layer formed on the nitride semiconductor crystal layer (template) on the substrate may be properly selected depending on the applications of the semiconductor wafer. The semiconductor layer may be continuously formed in the same crystal-growing apparatus as for the template, or in a crystal-growing apparatus different from that for the template. The semiconductor wafer of the present invention may be produced via grinding, etching, heat treatment, etc. in addition to the formation of the semiconductor layer.

The semiconductor device of the present invention is manufactured by using the nitride semiconductor wafer of the present invention. The nitride semiconductor wafer of the present invention may be provided with electrodes by vapor deposition, sputtering, etc., and subjected to surface oxidation, doping, photolithography, etching, washing, dicing, assembling, etc., to obtain nitride semiconductor devices such as transistors (high-electron mobility transistors (HEMTs), field-effect transistors (FETs), etc.), light-emitting diodes (LED), etc.

The present invention will be explained in detail referring to Examples below without intention of restricting the present invention thereto.

EXAMPLE 1

Figure 3:
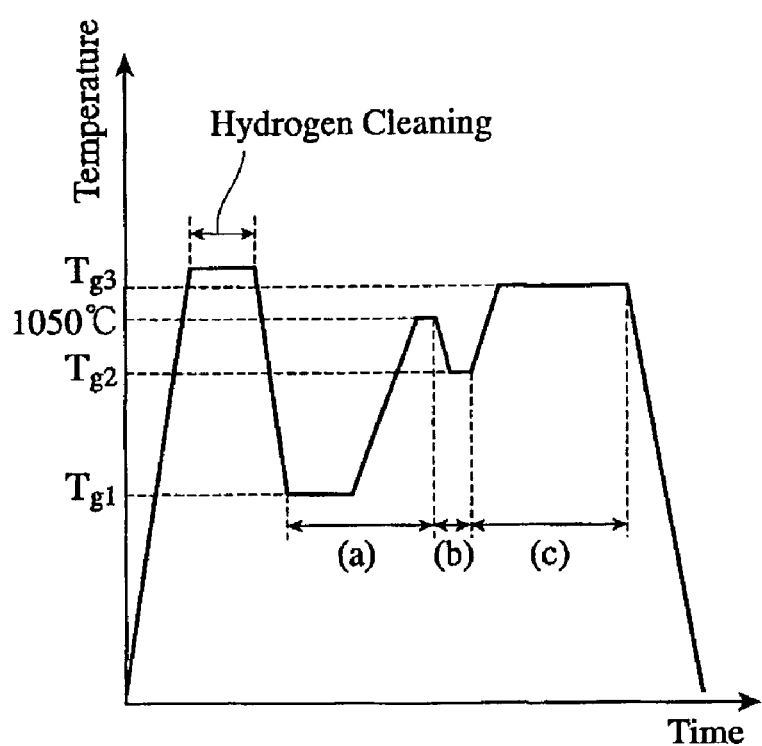
FIG. 3 is a graph showing temperature variation at the time of crystal growth according to one embodiment of the present invention.
Figure 4:
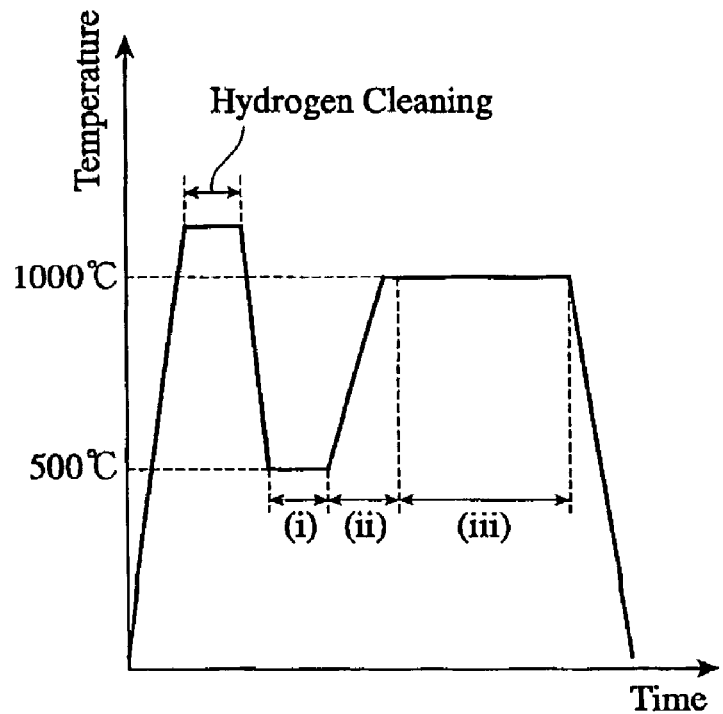
FIG. 4 is a graph showing temperature variation at the time of crystal growth by a conventional two-stage growing method.

FIG. 3 is a graph showing the temperature variation during crystal growth in this Example. A C-face sapphire substrate having a diameter of 50 mm and a thickness of 330 μm was placed in an MOVPE apparatus, and after removing oxides, etc. on the substrate surface by heating at 1200 C in a hydrogen atmosphere (hydrogen cleaning), the temperature of the sapphire substrate was lowered to 500 C. Using a trimethyl indium (TMI) gas as a starting material for In, a trimethyl gallium (TMG) gas as a starting material for Ga, an ammonia (NH$_3$) gas as a starting material for N, and a mixed gas of hydrogen/nitrogen or a hydrogen gas as a carrier gas, a nitride semiconductor crystal was caused to grow. The procedures of epitaxial growing were as described below.

First, fine crystal particles made of a nitride semiconductor were produced [step (a)]. 11 μmol/minute of a TMI gas, 380 μmol/minute of a TMG gas and an NH$_3$ gas at a speed of 10 slm were supplied as starting materials, together with an H$_2$ gas as a carrier gas at a speed of 140 slm. With a crystal-growing temperature $Tg_1$ of 500 C, a nitride semiconductor crystal made of In$_{0.03}$Ga$_{0.97}$N was caused to grow to a thickness $t_{FL}$ of 20 nm, and the resultant nitride semiconductor crystal buffer layer was immediately heated to 1050 C to form fine crystal particles on the substrate.

Next, using the fine crystal particles as nuclei, a crystal was caused to grow to form a nitride semiconductor island structure [step (b)]. In the step (b), 850 μmol/minute of a TMG gas and an NH$_3$ gas at a speed of 20 slm were supplied as starting material gases, and an H$_2$ gas at a speed of 20 slm and an N$_2$ gas at a speed of 60 slm were supplied as carrier gases. An atmosphere pressure in the growing apparatus was 760 Torr. With respect to each sample, a crystal-growing temperature $Tg_2$ was changed in a range from 800° C. to 1050° C. to form nitride semiconductor island structures made of GaN. The island structure had a thickness $t_{FL}$ of 600 nm. Further, with the same starting materials and carrier gases as in the step (b), a nitride semiconductor crystal layer was caused to grow from the nitride semiconductor island structure in a direction parallel with the substrate surface at a growing temperature $Tg_3$ of 1100° C., until $t_{FL}$ reached 2000 nm [step (c)].

Figure 5A:
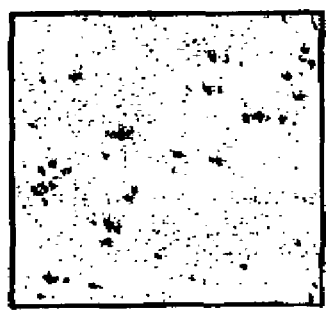
FIG. 5(a) is a photomicrograph showing a surface of a nitride semiconductor island structure at a crystal-growing temperature $Tg_2$ of 1050 C.
Figure 5B:
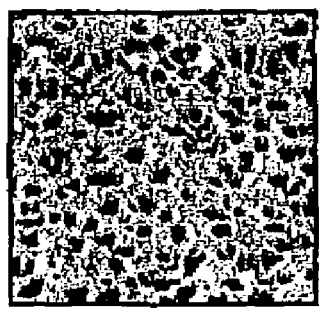
FIG. 5(b) is a photomicrograph showing a surface of a nitride semiconductor island structure at a crystal-growing temperature $Tg_2$ of 950 C.
Figure 5C:
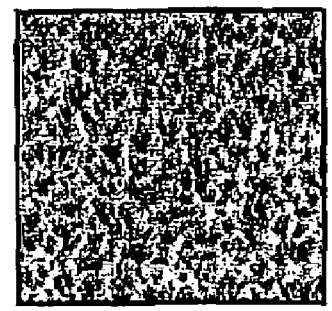
FIG. 5(c) is a photomicrograph showing a surface of a nitride semiconductor island structure at a crystal-growing temperature $Tg_2$ of 900 C.

FIG. 5 is a photomicrograph showing a surface of the nitride semiconductor island structure formed at each crystal-growing temperature $Tg_2$. As is clear from FIG. 5, when $Tg_2$ was 1050 C, there were a small number of the nitride semiconductor island structures observed on the surface, leaving flat portions. However, the percentage of a flat surface decreased as $Tg_2$ was lowered, and at $Tg_2$ of 900 C, the entire surface was covered by nitride semiconductor island structures in a shape of a polygonal pyramid.

Figure 6:
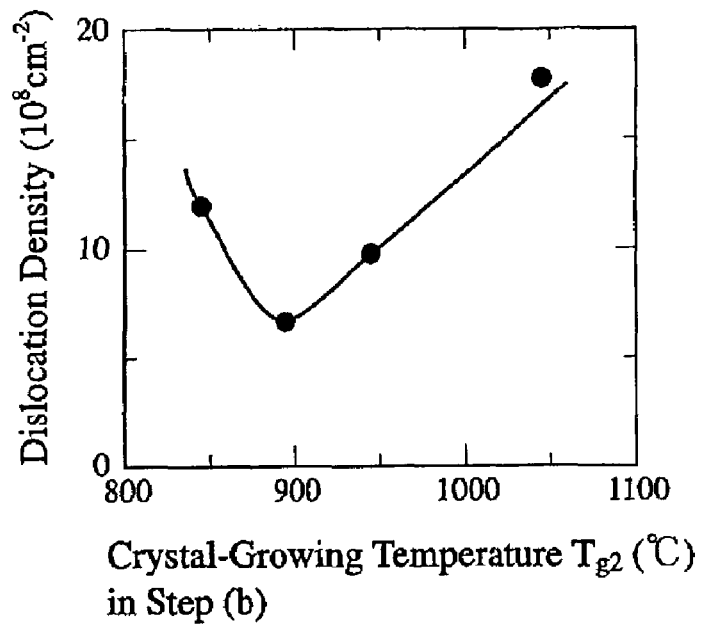
FIG. 6 is a graph showing the relation between a crystal-growing temperature $Tg_2$ and a dislocation density in the step (b)

A surface of the resultant nitride semiconductor crystal layer was observed by an electron microscope to measure the number of pits, thereby calculating a dislocation density. FIG. 6 is a graph showing the relation between the crystal-growing temperature $Tg_2$ and a dislocation density. In a range of $Tg_2$ from 900 C to 1050 C, the dislocation density decreased as the $Tg_2$ was lowered. The reason therefor is that as the $Tg_2$ was lowered, the formation of the nitride semiconductor island structure was accelerated in the step (b), resulting in decrease in the percentage of flat portions in the nitride semiconductor crystal surface, and thus increase in the percentage of inclined facets in the substrate surface. When the $Tg_2$ became lower than 900 C, the dislocation density rather increased. The reason therefor is that the crystallinity of GaN decreased because of a low crystal-growing temperature. The dislocation density at $Tg_2$ of 900 C was $6.3\times10^8$ cm$^{-2}$, minimum in a range of 800 C$\leq Tg_2 \leq$1050 C. This indicates that when the $Tg_2$ is about 900 C, a nitrade semiconductor island structure is formed on the entire surface, resulting in decrease in the dislocation density. Because a GaN layer formed by the conventional two-stage growing method has a dislocation density of about $10^9$ cm$^{-2}$, it is concluded that this Example succeeded in the drastic reduction of the dislocation density as compared with the conventional technologies.

EXAMPLE 2

Figure 7:
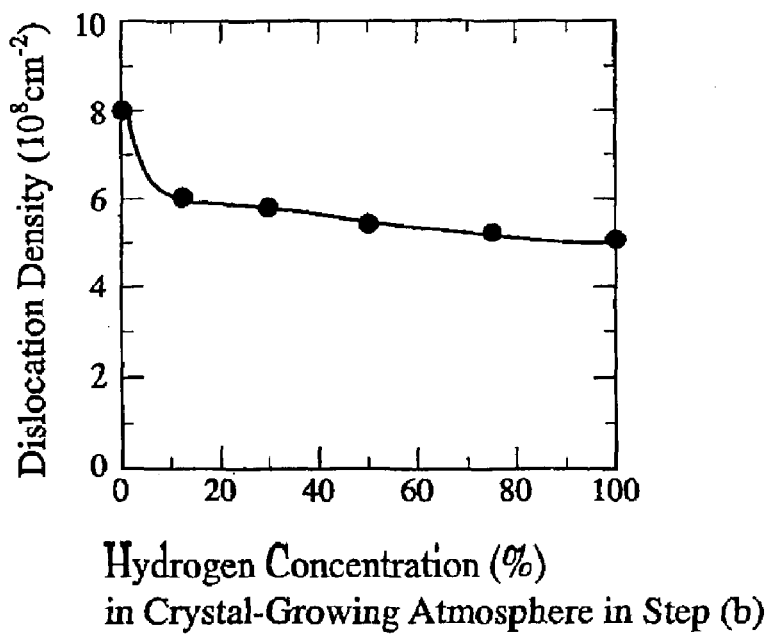
FIG. 7 is a graph showing the relation between the hydrogen concentration in a crystal-growing atmosphere and a dislocation density in the step (b)

Investigation was conducted on the relation between a hydrogen concentration in the crystal-growing atmosphere and a dislocation density in the step (b). A nitride semiconductor crystal was caused to grow on the substrate, and the dislocation density on a surface of the resultant nitride semiconductor crystal layer was investigated, in the same manner as in Example 1 except for changing a ratio of an $H_2$ gas to an $N_2$ gas in the carrier gas, and setting a crystal-growing temperature $Tg_2$ at 900 C in the step (b). At this time, with the total flow rate of the carrier gas (80 slm) kept constant, the concentration of an $H_2$ gas was changed in a range of 0-100%. FIG. 7 is a graph showing the relation between the hydrogen concentration in the atmosphere and a dislocation density. As is clear from FIG. 7, as the hydrogen concentration increased, the dislocation density decreased, and when the hydrogen concentration was 100%, the dislocation density was $5.2\times10^8$ cm$^{-2}$. This appears to be due to the fact that the higher the hydrogen concentration in the crystal-growing atmosphere, the more the formation of the nitride semiconductor island structure was accelerated, resulting in decrease in the percentage of crystal faces parallel with the substrate surface.

EXAMPLE 3

Figure 8:
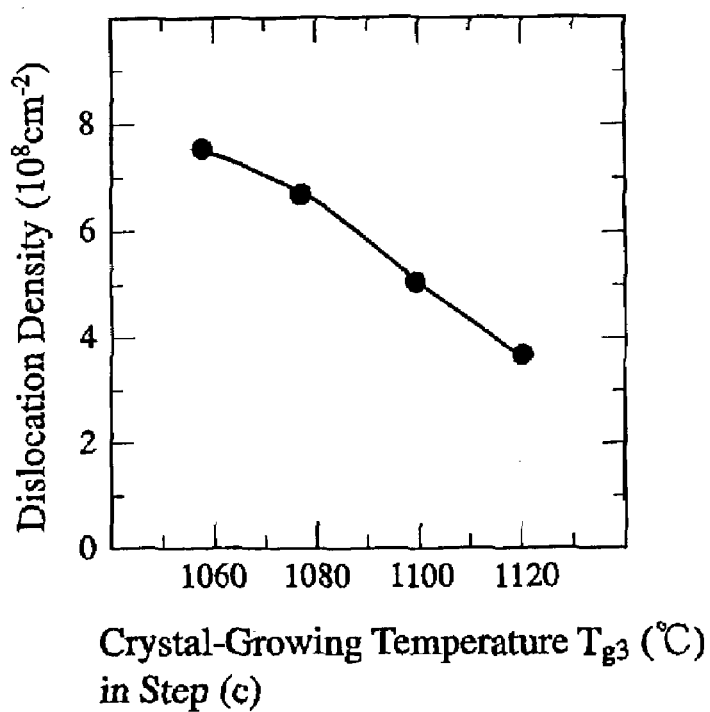
FIG. 8 is a graph showing the relation between a crystal-growing temperature $Tg_3$ and a dislocation density in the step (c)

Investigation was conducted on the relation between the crystal-growing temperature $Tg_3$ and a dislocation density in the step (c). A nitride semiconductor crystal was caused to grow on the substrate, and the dislocation density on the surface of the resultant nitride semiconductor crystal layer was investigated, in the same manner as in Example 2 except for changing $Tg_3$, and setting the hydrogen concentration in the crystal-growing atmosphere at 100% in the step (b). FIG. 8 is a graph showing the relation between the crystal-growing temperature $Tg_3$ and a dislocation density. As is clear from FIG. 8, as the $Tg_3$ increased, the dislocation density decreased, and the dislocation density was $3.8\times10^8$ cm$^{-2}$ at $Tg_3$ of 1120 C. This appears to be due to the fact that the higher the growing temperature of the nitride semiconductor crystal layer in the step (c), the more the growth in a lateral direction was accelerated, exerting larger effect on changing the propagation directions of dislocations.

EXAMPLE 4

Figure 9:
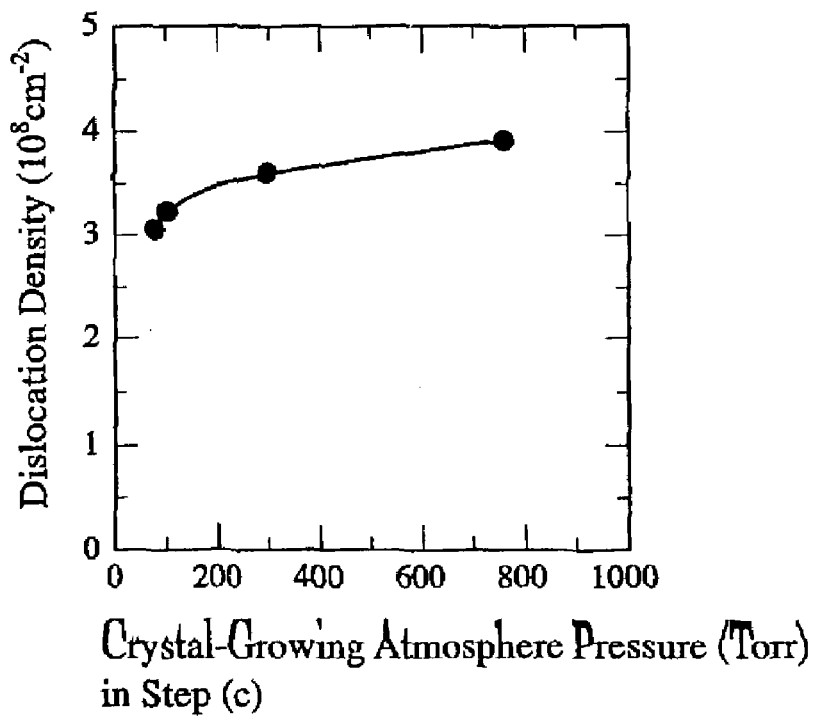
FIG. 9 is a graph showing the relation between a crystal-growing atmosphere pressure and a dislocation density in the step (c)

Investigation was conducted on the relation between the crystal-growing atmosphere pressure in the step (c) and a dislocation density. A nitride semiconductor crystal was caused to grow on the substrate, and the dislocation density on the surface of the resultant nitride semiconductor crystal layer was investigated, in the same manner as in Example 3 except for changing the flow rate of the carrier gas by changing the atmosphere pressure in the growing apparatus, and setting the crystal-growing temperature $Tg_3$ at 1120 C in the step (c). FIG. 9 is a graph showing the relation between the crystal-growing atmosphere pressure in the step (c) and a dislocation density. As is clear from FIG. 9, the dislocation density decreased with the reduction of an atmosphere pressure, and the dislocation density was $3\times10^8$ cm$^{-2}$ at an atmosphere pressure of 76 Torr. It is presumed that the lower the atmosphere pressure in the step (c), the more the growth in a lateral direction was accelerated, exerting larger effect on changing the propagation directions of dislocations.

EXAMPLE 5

A dislocation density was investigated, when a nitride semiconductor island structure and a nitride semiconductor crystal layer had different compositions. As shown in FIG. 2, a nitride semiconductor crystal was caused to grow on the substrate, and the dislocation density on the surface of the resultant nitride semiconductor crystal layer was investigated, in the same manner as in Example 4, except that the nitride semiconductor crystal layer growing from the nitride semiconductor island structure in a direction parallel with the substrate surface was a laminate of $Al_yGa_{1-y}N$ (0<y$\leq$1) and GaN, and that the crystal-growing atmosphere pressure was 76 Torr in the step (c). In this Example, trimethyl aluminum (TMA) as an Al starting material, which was mixed with the other starting material gases, was supplied in the step (c), and after a nitride semiconductor crystal made of $Al_yGa_{1-y}N$, in which y was 0.05, 0.2 or 1, was caused to grow to a thickness of 10-200 nm, a nitride semiconductor crystal made of GaN was caused to grow to a thickness of 2000 nm.

Figure 10:
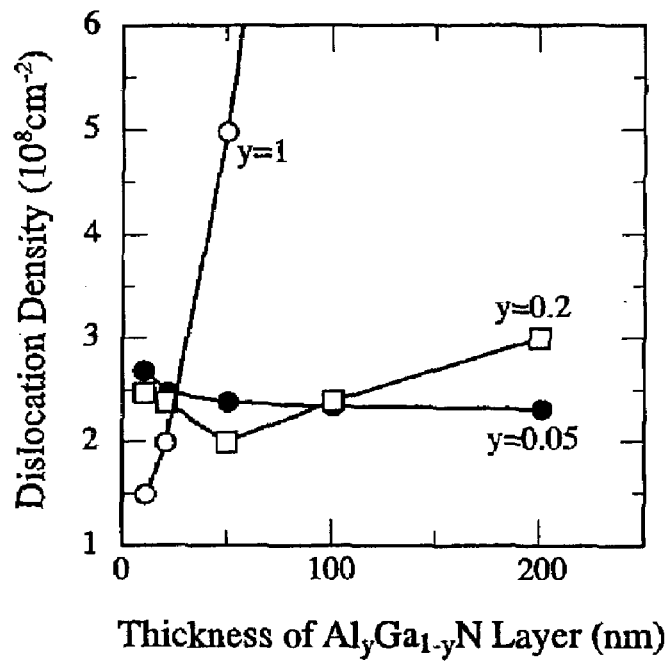
FIG. 10 is a graph showing the relation between the thickness of an $Al_yGa_{1-y}N$ layer and a dislocation density.

FIG. 10 is a graph showing the relation between thickness $t_{FL}$ of the $Al_yGa_{1-y}N$ layer and a dislocation density with respect to each y. When y was 0.05, increase in the thickness of the $Al_yGa_{1-y}N$ layer ($Al_{0.05}Ga_{0.95}N$ layer) resulted in gradual decrease in the dislocation density, and at a thickness $t_{FL}$ of 200 nm, the dislocation density was $2.4\times10^8$ cm$^{-2}$. It is presumed that a lattice strain was introduced by materials having different compositions in contact with the surface of the island structure, changing the propagation directions of dislocations and thus decreasing the dislocation density on the surface. When y was 0.2, the dislocation density decreased as the thickness $t_{FL}$ of the $Al_yGa_{1-y}N$ layer ($Al_{0.2}Ga_{0.8}N$ layer) increased in a range of 10-50 nm. Though the dislocation density was $2\times10^8$ cm$^{-2}$ at a thickness $t_{FL}$ of 50 nm, the dislocation density rather increased when the $Al_{0.2}Ga_{0.8}N$ layer became thicker than 50 nm. When y was 1, namely, when AlN was caused to grow, too, the dislocation density was $1.5\times10^8$ cm$^{-2}$ at a thickness $t_{FL}$ of 10 nm, and increase in the thickness resulted in rapid increase in the dislocation density. It is presumed that when y is 0.2 or more, new dislocations are likely to occur due to lattice mismatch with a next growing GaN, so that a thick $Al_yGa_{1-y}N$ layer would rather increase the dislocation density.

EXAMPLE 6

Investigation was conducted on the relation between the addition of Mg to a nitride semiconductor crystal layer and a dislocation density. A nitride semiconductor crystal was caused to grow on the substrate, and the dislocation density on the surface of the resultant nitride semiconductor crystal layer was investigated, in the same manner as in Example 4 except for supplying a bicyclopentadienyl magnesium gas as a starting material for Mg, which was added to the other starting material gas, and setting the crystal-growing atmosphere pressure at 76 Torr in the step (c). When Mg was added in a proportion of $5 \times 10^{20}$ cm$^{-3}$ to a nitride semiconductor crystal growing in a direction parallel with the substrate surface, the dislocation density was $1 \times 10^8$ cm$^{-2}$. It is presumed that Mg accelerates crystal growth in a lateral direction, resulting in large effect of changing the propagation directions of dislocations, and thus reducing the dislocation density on the surface.

EXAMPLE 7

Investigation was conducted on the relation between the addition of Si to a nitride semiconductor island structure and the dislocation density on the surface of a nitride semiconductor crystal layer. A nitride semiconductor crystal was caused to grow on the substrate, and the dislocation density on the surface of the resultant semiconductor layer was investigated, in the same manner as in Example 6 except for supplying tetraethyl silane (TESi), a starting material for Si, which was added to the other starting material gas, in the step (b). When Si was added in a proportion of $5 \times 10^{19}$ cm$^{-3}$ to the nitride semiconductor island structure, the dislocation density on the surface of a nitride semiconductor crystal layer was $8 \times 10^7$ cm$^{-2}$. It is presumed that Si accelerates crystal growth in an island pattern, resulting in decrease in the percentage of crystal faces parallel with the substrate surface.

EXAMPLE 8

Figure 11:
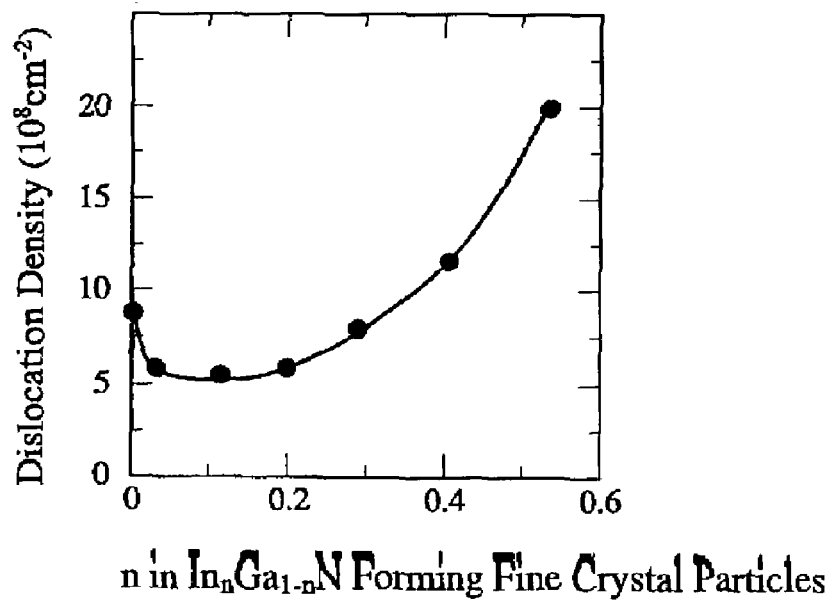
FIG. 11 is a graph showing the relation between n in $In_nGa_{1-n}N$ forming fine crystal particles and a dislocation density.

Investigation was conducted on the relation between the composition of fine crystal particles made of a nitride semiconductor and a dislocation density. A nitride semiconductor crystal was caused to grow on the substrate, and the dislocation density on the surface of the resultant nitride semiconductor crystal layer was investigated in the same manner as in Example 1 except for changing n in $In_nGa_{1-n}N$ as the composition of fine crystal particles, and setting the crystal-growing temperature $Tg_2$ at 900 C in the step (b). FIG. 11 is a graph showing the relation between n in $In_nGa_{1-n}N$ and a dislocation density. When n was 0, namely when the fine crystal particles were made of GaN, too, the resultant nitride semiconductor crystal layer had a lower dislocation density than the dislocation density (about $10^9$ cm$^{-2}$) of a nitride semiconductor crystal layer obtained by a conventional two-stage growing method. However, when n was in a range of 0.02-0.2, the dislocation density further decreased to about $6 \times 10^8$ cm$^{-2}$. When n was larger than 0.2, the dislocation density in turn increased, and the dislocation density was as large as $1 \times 10^9$ cm$^{-2}$ or more at n of larger than 0.4. It is presumed that the ratio of In in $In_nGa_{1-n}N$ affects the density of fine crystal particles, resulting in the change of the dislocation density on the surface of the nitride semiconductor crystal layer.

EXAMPLE 9

Using a substrate having a finely ragged surface, fine crystal particles of a nitride semiconductor were formed. A GaN crystal was caused to grow to 2000 nm by an MOVPE method on a C-face sapphire substrate to form a composite substrate (dislocation density on the GaN surface: $1 \times 10^9$ cm$^{-2}$). The resultant composite substrate was exposed to an ozone atmosphere for 10 minutes to provide the GaN surface with fine roughness, and then a GaN crystal was caused to grow to a thickness $t_{FL}$ of 20 nm at a growing temperature of 1000 C by an MOVPE method to form fine crystal particles. A nitride semiconductor island structure and a nitride semiconductor crystal layer were formed on the resultant fine crystal particles, in the same manner as in Example 1 except for setting the crystal-growing temperature $Tg_2$ at 900 C. The dislocation density on a surface of the resultant nitride semiconductor crystal layer was $7 \times 10^8$ cm$^{-2}$.

EXAMPLE 10

A GaN crystal was caused to grow to 2000 nm on a C-face sapphire substrate by an MOVPE method to form a composite substrate (dislocation density on GaN surface: $1 \times 10^9$ cm$^{-2}$). The resultant composite substrate was heated to 1000 C for 10 minutes in an MOVPE apparatus with a hydrogen atmosphere to provide the GaN surface with fine roughness, and then a GaN crystal was caused to grow to a thickness $t_{FL}$ of 20 nm at a growing temperature of 1000 C to form fine crystal particles made of a nitride semiconductor. A nitride semiconductor island structure and a nitride semiconductor crystal layer were formed on the resultant fine crystal particles, in the same manner as in Example 1 except for setting the crystal-growing temperature $Tg_2$ at 900 C. The dislocation density on a surface of the resultant nitride semiconductor crystal layer was $5 \times 10^8$ cm$^{-2}$.

Example 11

Using a substrate partially covered by Si, fine crystal particles of a nitride semiconductor were formed. A GaN crystal was caused to grow to 2000 nm on a C-face sapphire substrate by an MOVPE method to form a composite substrate (dislocation density on GaN surface: $1 \times 10^9$ cm$^{-2}$), and 1 mmol of tetraethyl silane (TESi) was brought into contact with the GaN surface. Thus, Si reacted with $NH_3$ in the growing atmosphere, so that a nitrogen silicon film partially covering the GaN surface of the composite substrate was formed. Next, a GaN crystal was caused to grow on the composite substrate at a growing temperature of 1100 C by an MOVPE method, and the crystal grew selectively in portions not covered by silicon nitride on the substrate surface, resulting in the formation of fine crystal particles. A nitride semiconductor island structure and a nitride semiconductor crystal layer were formed on the resultant fine crystal particles, in the same manner as in Example 1 except for setting the crystal-growing temperature $Tg_2$ at 900 C. The dislocation density on a surface of the resultant nitride semiconductor crystal layer was $5 \times 10^7$ cm$^{-2}$.

Example 12

Investigated was conducted on the relation between the growing speed of a nitride semiconductor crystal and a dislocation density. A nitride semiconductor crystal was caused to grow on the substrate, and the dislocation density on the surface of the resultant nitride semiconductor crystal layer was investigated, in the same manner as in Example 1 except for reducing the flow rate of a starting material gas comprising a TMG gas and an $NH_3$ gas to half, and setting the crystal-growing temperature $Tg_2$ at 900 C in the step (b). Because the flow rate of a starting material gas in the step (c) was the same as in Example 1, a crystal-growing speed in the step (b) was half of the speed in the step (c). The dislocation density on a surface of the resultant nitride semiconductor crystal layer was $3 \times 10^8$ $cm^{-2}$. It is presumed that a small crystal-growing speed in the step (b) accelerates the formation of the nitride semiconductor island structure having inclined facets relative to the substrate surface.

EXAMPLE 13

Figure 12:
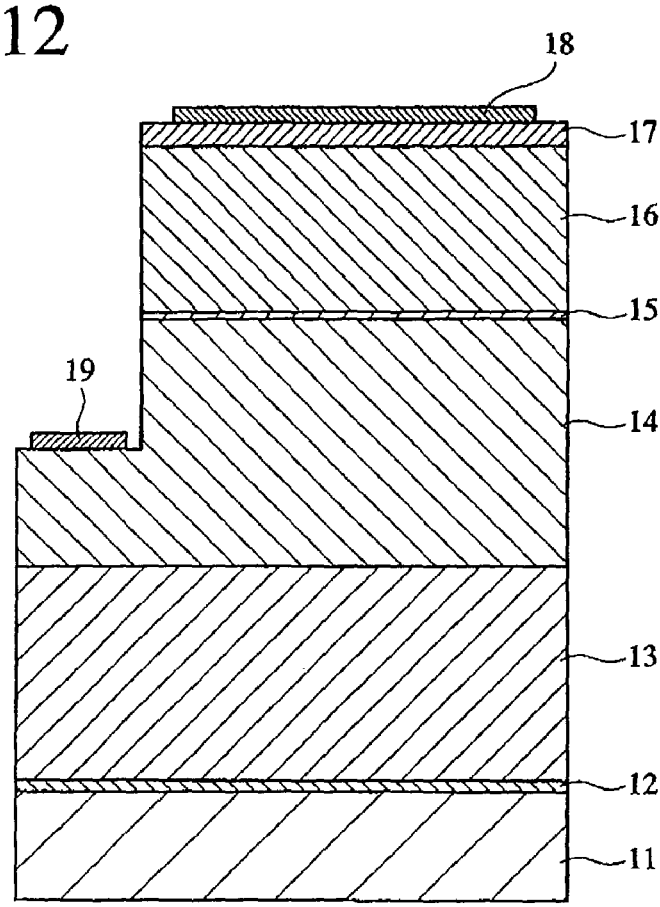
FIG. 12 is a schematic view showing the cross section structure of a light-emitting diode according to one embodiment of the present invention.

A low-temperature buffer layer 12 made of fine crystal particles of a nitride semiconductor, and an undoped GaN layer 13 having a surface dislocation density of $3 \times 10^8$ $cm^{-2}$ were formed on the sapphire substrate 11, in the same manner as in Example 4 except for setting the crystal-growing atmosphere pressure at 76 Torr in the step (c). As shown in FIG. 12, an n-GaN layer 14 having a thickness of 3 μm, a multiple-quantum well layer 15 of 2-nm-thick InGaN and 5-nm-thick GaN, a p-AlGaN layer 16 having a thickness of 2 μm, and a p-InGaN contact layer 17 having a thickness of 0.05 μm were successively formed on the undoped GaN layer 13, to provide a nitride semiconductor wafer. A surface of the resultant wafer was partially removed by reactive ion etching (RIE), so that part of the n-GaN layer 14 was exposed to form a Ti/Al electrode 19. Further, an Ni/Au electrode 18 was formed on the p-InGaN contact layer 17 to provide a light-emitting diode (LED).

An LED for comparison was produced in the same manner as in this Example except for forming an undoped GaN layer having a dislocation density of $1 \times 10^9$ $cm^{-2}$ by a conventional two-stage growing method. When electric current of 20 mA was supplied to each of the resultant LEDs, the LEDs of Examples (the present invention) had a light emission output of 13 mW, while the LEDs for comparison had a light emission output of 5 mW. This proved that the light-emitting devices of the present invention obtained by using a low-dislocation-density, undoped GaN layer had extremely better characteristics than those obtained by an undoped GaN layer by the conventional two-stage growing method.

EXAMPLE 14

Figure 13:
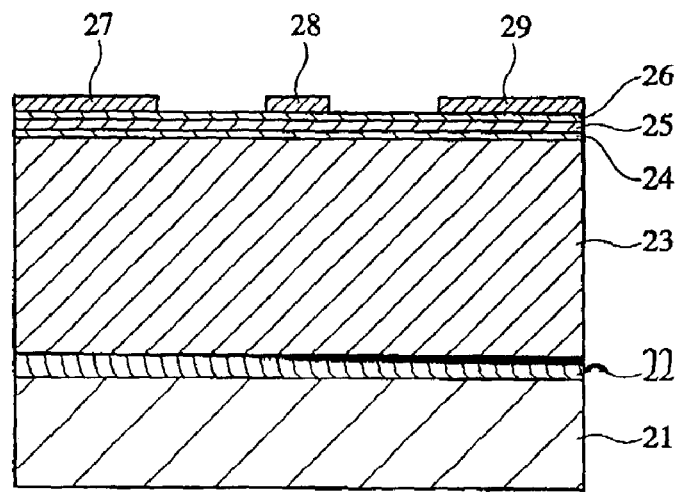
FIG. 13 is a schematic view showing the cross section structure of a high-electron mobility transistor according to one embodiment of the present invention.

A low-temperature buffer layer 22 made of fine crystal particles of a nitride semiconductor, and an undoped GaN layer 23 having a surface dislocation density of $3 \times 10^8$ $cm^{-2}$ were formed on a sapphire substrate 21, in the same manner as in Example 4 except for setting the crystal-growing atmosphere pressure at 76 Torr and the thickness of the undoped GaN layer 23 at 3 μm in the step (c). As shown in FIG. 13, an undoped AlGaN layer 24 having a thickness of 0.01 μm, an n-AlGaN layer 25 having a thickness of 0.02 μm, and an undoped AlGaN layer 26 having a thickness of 0.01 μm were successively formed on the undoped GaN layer 23, to provide a nitride semiconductor wafer. A source electrode 27, a gate electrode 28 and a drain electrode 29 were formed on the resultant wafer by photolithography and vapor deposition, to produce a high-electron mobility transistor (HEMT).

An HEMT for comparison was also produced in the same manner as in this Example except for using an undoped GaN layer (dislocation density: $1 \times 10^9$ $cm^{-2}$) formed by the conventional two-stage growing method. The investigation of DC transfer characteristics in the resultant HEMTs indicated that the HEMTs of Examples (the present invention) had mutual conductance of 215 mS/mm, while the HEMTs for comparison had mutual conductance of 82 mS/mm. It is presumed that because the HEMTs of Examples (the present invention) are smaller than the HEMTs for comparison in a surface dislocation density on the undoped GaN layer, the former is improved in the reduction of a gate leak current and the controllability of a two-dimensional electron density by gate voltage than the latter.

Though the present invention has been explained in detail referring to Examples above, the present invention is not restricted thereto and may be subjected to various modifications within the scope of the present invention. For instance, though explanation has been mainly on epitaxial growing by the MOVPE method, the present invention is not restricted thereto, and nitride semiconductor crystals can be caused to grow by an HVPE method.

As described above in detail, because the method for producing a nitride semiconductor crystal according to the present invention allows the propagation directions of dislocations to change on a surface of a nitride semiconductor island structure having a plurality of facets inclined relative to a substrate surface, it is possible to form a nitride semiconductor crystal layer having a small dislocation density on the entire surface of the subtrate. Accordingly, it is possible to obtain a nitride semiconductor device having excellent device characteristics and stability by using the nitride semiconductor crystal obtained by the production method of the present invention.

What is claimed is:

1. A method for producing a nitride semiconductor crystal comprising steps (a), (b) and (c), which steps follow in sequence as follows: a step (a) for forming fine crystal particles made of a nitride semiconductor on a substrate; a step (b) for forming a nitride semiconductor island structure comprising substantially polygonal pyramids and thus having a plurality of facets inclined relative to a surface of said substrate using said fine crystal particles as nuclei; and a step (c) for causing said nitride semiconductor island structure to grow in a direction parallel with a surface of said substrate to merge a plurality of said nitride semiconductor island structures with each other, thereby forming a nitride semiconductor crystal layer having a flat surface; said steps (a)-(c) being continuously conducted in the same growing apparatus, wherein the conditions of growing said nitride semiconductor crystal are different in said steps (a)-(c), and wherein at least one of a temperature, an atmosphere pressure, a speed and an atmosphere composition for crystal growth is different among said steps (a)-(c), wherein said substrate has a surface roughness of 5 μm or less by TTV (total thickness variation) and wherein said step (a) comprises a step for forming a nitride semiconductor crystal buffer layer on said substrate at a lower temperature $Tg_1$ than a crystal-growing temperature in said step (b) $Tg_2$ and said step (c) $Tg_3$, and a step for heat-treating said nitride semiconductor crystal buffer layer at a higher temperature than its crystal-growing temperature $Tg_1$ to form said fine crystal particles, whereby step (a) thus comprises two separate steps at two separate temperatures such that a temperature $Tg_1$, at which said nitride semiconductor crystal buffer layer is formed, is 400 to 800° C. and the heat-treating temperature of said nitride semiconductor crystal buffer layer is 800 to 1200° C. and wherein the crystal-growing temperature is 800 to 1050° C. for $Tg_2$ in said step (b) and 1060 to 1200° C. for $Tg_3$ in said step (c).

2. The method for producing a nitride semiconductor crystal according to claim 1, wherein said substrate is made of a nitride semiconductor, sapphire, silicon carbide, silicon, zinc oxide, $LiGaO_2$ or $LiAlO_2$.

3. The method for producing a nitride semiconductor crystal according to claim 1, wherein said substrate is a composite substrate having a nitride semiconductor layer formed in a perpendicular direction to a surface of a substrate body made of a nitride semiconductor, sapphire, silicon carbide, silicon, zinc oxide, $LiGaO_2$ or $LiAlO_2$.

4. The method for producing a nitride semiconductor crystal according to claim 3, wherein fine nitride semiconductor crystal particles are formed on said composite substrate having fine roughness with the surface roughness of said composite substrate acting as nuclei.

5. The method for producing a nitride semiconductor crystal according to claim 4, wherein a nitride semiconductor layer surface of said composite substrate is exposed to an ozone atmosphere, to form fine roughness on a surface of said composite substrate.

6. The method for producing a nitride semiconductor crystal according to claim 4, wherein a nitride semiconductor layer surface of said composite substrate is heat-treated to form fine roughness on a surface of said composite substrate.

7. The method for producing a nitride semiconductor crystal according to claim 4, wherein a nitride semiconductor layer surface of said composite substrate is brought into contact with an etching gas to form fine roughness on a surface of said composite substrate.

8. The method for producing a nitride semiconductor crystal according to claim 3, wherein said nitride semiconductor crystal is caused to grow on said composite substrate partially covered by a material hindering interactions between atoms constituting the nitride semiconductor layer of said composite substrate, and atoms constituting the nitride semiconductor crystal growing in said step (a), thereby forming said fine crystal particles.

9. The method for producing a nitride semiconductor crystal according to claim 8, wherein said material hindering interactions between said atoms is silicon, oxygen, silicon nitride, silicon oxide or a metal.

10. The method for producing a nitride semiconductor crystal according to claim 3, wherein said step (a) comprises placing said composite substrate in a growing apparatus, and introducing a starting material gas into said growing apparatus to form said fine crystal particles made of a nitride semiconductor.

11. The method for producing a nitride semiconductor crystal according to claim 1, wherein part or all of the growing of said nitride semiconductor crystal is conducted by an MOVPE method or an HVPE method.

12. The method for producing a nitride semiconductor crystal according to claim 1, wherein said nitride semiconductor crystal is caused to grow, by selecting at least one of a crystal growth condition (1) that a crystal-growing temperature $Tg_2$ said step (b) is lower than that $Tg_3$ in said step (c), a crystal growth condition (2) that the hydrogen concentration in a crystal-growing atmosphere in said step (b) is higher than tat in said step (c), a crystal growth condition (3) that a crystal-growing atmosphere pressure in said step (b) is higher than that in said step (c), and a crystal growth condition (4) that a crystal-growing speed in said step (b) is lower than that in said step (c), wherein the hydrogen concentration in the crystal-growing atmosphere is 50% or more in said step (b) and 0 to 30% in said step (c).

13. The method for producing a nitride semiconductor crystal according to claim 12, wherein the crystal-growing atmosphere pressure is 300 to 800 Torr in said step (b) and 70 to 150 Torr in said step (c).

14. The method for producing a nitride semiconductor crystal according to claim 12, wherein the crystal-growing speed is 0.1 to 4 μm/hr in said step (b) and 2 to 8 μ/hr in said step (c).

15. The method for producing a nitride semiconductor crystal according to claim 1, wherein said fine crystal particles of a nitride semiconductor are made of $In_nGa_{1-n}N$ ($0<n\leq 0.3$).

16. The method for producing a nitride semiconductor crystal according to claim 1, wherein said nitride semiconductor island structure is made of GaN.

17. The method for producing a nitride semiconductor crystal according to claim 1, wherein said nitride semiconductor crystal layer formed in said step (c) is made of GaN.

18. The method for producing a nitride semiconductor crystal according to claim 1, wherein said nitride semiconductor island structure, and said nitride semiconductor crystal layer growing from said nitride semiconductor island structure in a direction parallel with said substrate surface have different compositions.

19. The method for producing a nitride semiconductor crystal according to claim 18, wherein any of said nitride semiconductor island structure and said nitride semiconductor crystal layer has a composition represented by $In_xAl_yGa_zN$ (x+y+z=1), though they have different contents of In and/or Al.

20. The method for producing a nitride semiconductor crystal according to claim 19, wherein said nitride semiconductor crystal layer is constituted by a layer having a composition represented by $Al_yGa_{1-y}N$ ($0<y\leq 1$) and a layer having a composition represented by GaN.

21. The method for producing a nitride semiconductor crystal according to claim 1, wherein said nitride semiconductor island structure is formed by a nitride semiconductor crystal, to which In, Al or Si is added, in said step (b).

22. The method for producing a nitride semiconductor crystal according to claim 1, wherein said nitride semiconductor crystal layer is caused to grow by a nitride semiconductor crystal, to which Mg is added, in said step (c).

* * * * *